(12) United States Patent
Leobandung et al.

(10) Patent No.: US 10,096,975 B1
(45) Date of Patent: Oct. 9, 2018

(54) LATERALLY GROWN EDGE EMITTING LASER

(71) Applicant: INTERNATIONAL BUSINESS MACHINES CORPORATION, Armonk, NY (US)

(72) Inventors: Effendi Leobandung, Stormville, NY (US); Ning Li, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/470,226

(22) Filed: Mar. 27, 2017

(51) Int. Cl.
  *H01S 5/343* (2006.01)
  *H01S 5/30* (2006.01)
  *H01S 5/02* (2006.01)

(52) U.S. Cl.
  CPC ........ *H01S 5/34313* (2013.01); *H01S 5/0203* (2013.01); *H01S 5/3054* (2013.01)

(58) Field of Classification Search
  CPC ... H01S 5/34313; H01S 5/0203; H01S 5/3054
  See application file for complete search history.

(56) References Cited

U.S. PATENT DOCUMENTS

| | | | |
|---|---|---|---|
| 4,691,320 A * | 9/1987 | Dinkel | H01L 33/0062 372/45.01 |
| 9,136,673 B2 | 9/2015 | Holder et al. | |
| 9,543,478 B2 | 1/2017 | Schricker et al. | |
| 2013/0015465 A1 * | 1/2013 | Lee | H01L 33/40 257/76 |
| 2015/0076538 A1 | 3/2015 | Lei et al. | |
| 2015/0084058 A1 | 3/2015 | Singh et al. | |
| 2016/0372893 A1 | 12/2016 | McLaurin et al. | |

* cited by examiner

*Primary Examiner* — Dung Nguyen
(74) *Attorney, Agent, or Firm* — F. Chau & Associates, LLC

(57) ABSTRACT

A laterally grown edge emitting laser is provided. A semiconductor structure is disposed on a substrate. A first, a second and a third III-V optical layers are sequentially and laterally grown on and from a sidewall of the semiconductor structure. A cladding semiconductor layer is disposed next to the third III-V optical layer and electrically connected to the III-V optical layer. Then, a first contact structure and a second contact structure is disposed on and electrically connected to the semiconductor structure and the cladding semiconductor layer, respectively. In the edge emitting laser, each of the first, second and third III-V optical layers may independently include a III-V semiconductor including at least one of group III elements of boron (B), gallium (Ga), aluminum (Al) and indium (In), and at least one of group V elements of nitrogen (N), phosphorus (P), arsenic (As), antimony (Sb) and bismuth (Bi). The laterally grown edge emitting laser may be integrated with a metal-oxide-semiconductor field-effect transistor (MOSFET). A method for manufacturing the laterally grown edge emitting laser is also provided.

12 Claims, 7 Drawing Sheets

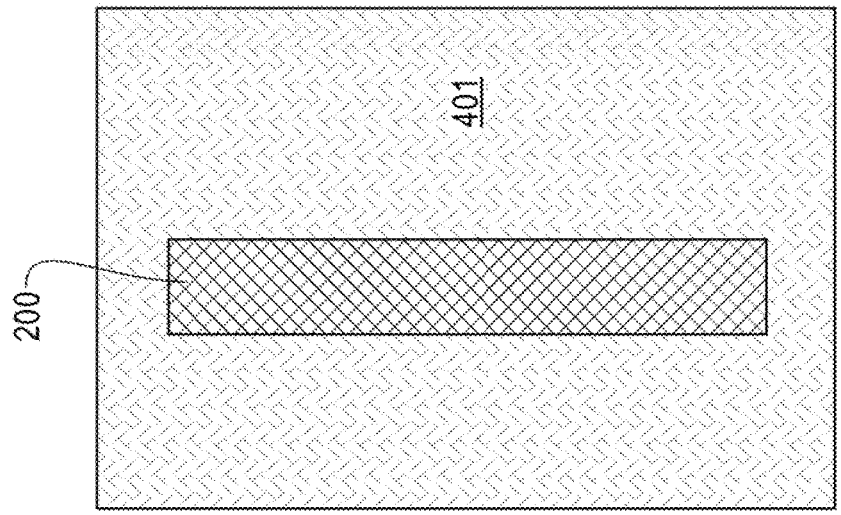
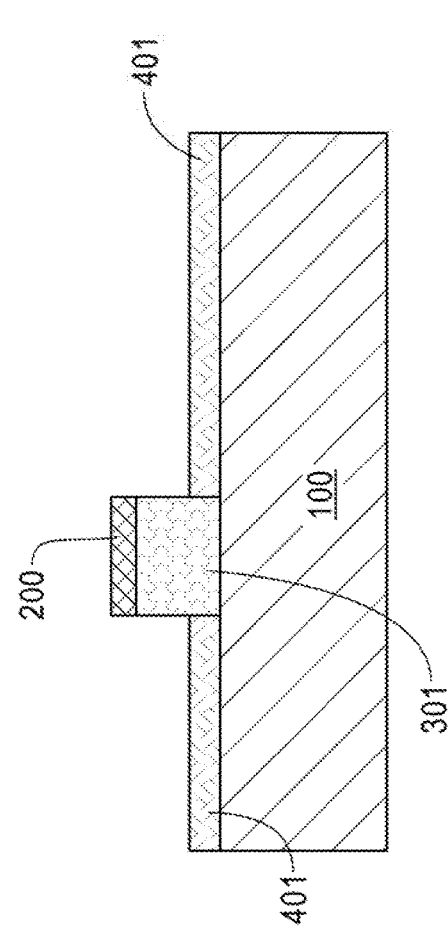
FIG. 4B
FIG. 4A

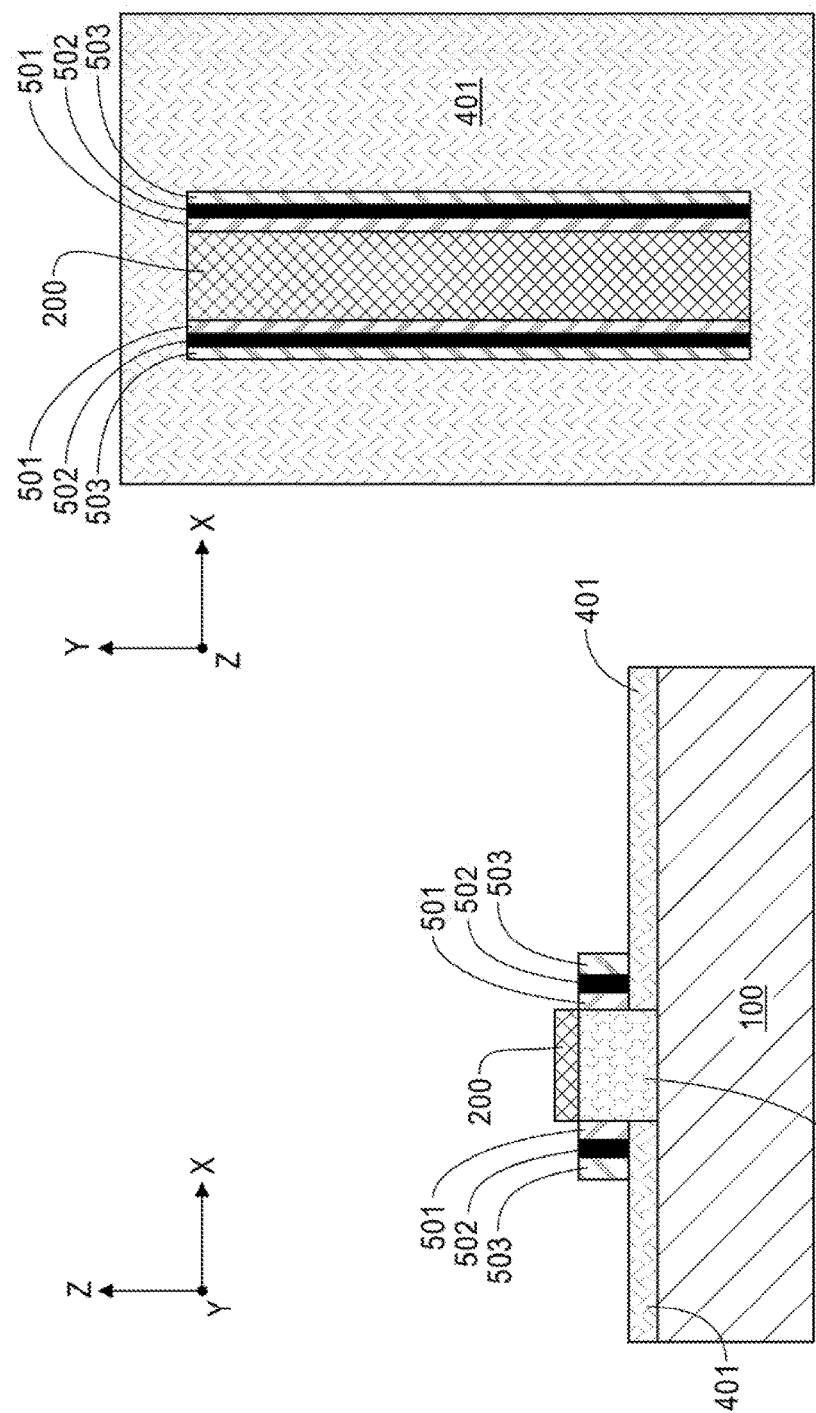

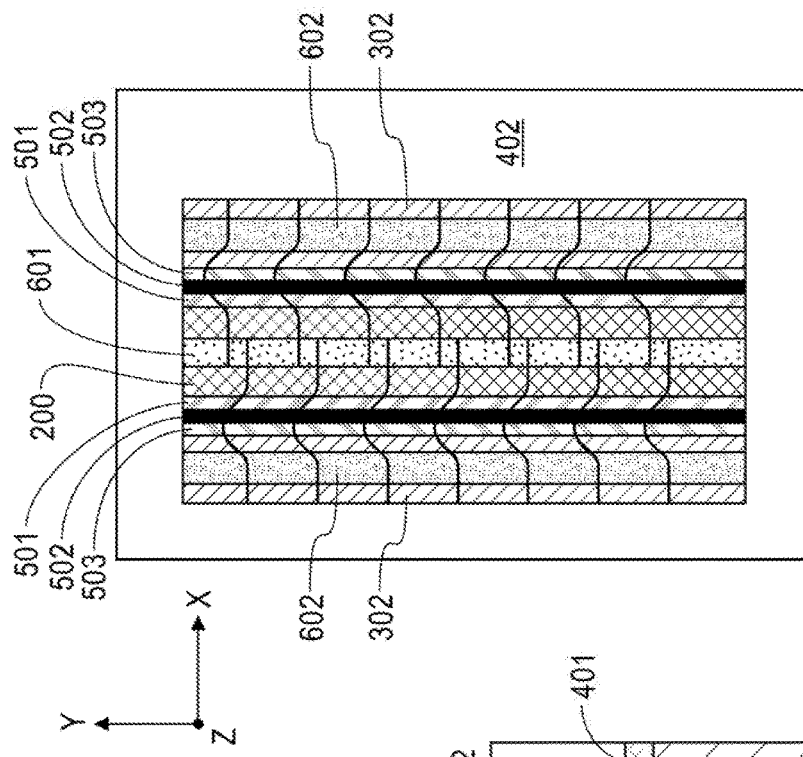
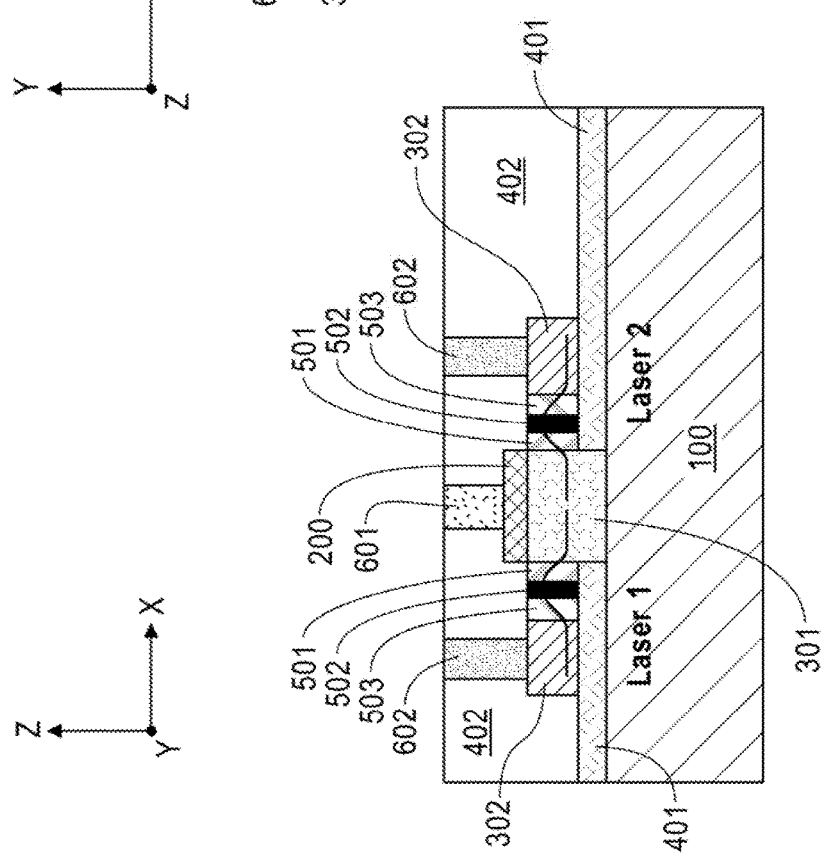
FIG. 7B
FIG. 7A

LATERALLY GROWN EDGE EMITTING LASER

FIELD OF THE INVENTION

This invention relates generally to an edge emitting laser and a method of manufacturing the same, and more particularly to a laterally grown edge emitting laser and a method of manufacturing the same.

BACKGROUND OF THE INVENTION

Semiconductor light-emitting devices may include, for example, light emitting diodes (LEDs) and semiconductor lasers, and may provide high light efficiency. The semiconductor lasers can be classified as two groups: edge emitting lasers, and surface emitting lasers. For edge emitting lasers, the laser light propagates parallel to the wafer surface, while the surface emitting lasers the laser light propagates in the direction perpendicular to the semiconductor wafer surface. The edge emitting lasers are capable of providing high laser output power, simple to fabricate, having high efficiency and compatible with high speed modulation, and thus are used in the fiber optic communication devices for high speed data transmission.

Materials currently used in manufacturing edge emitting laser include Group III-V semiconductors, particularly binary, ternary, and quaternary alloys of group III elements such as gallium, aluminum, and indium, and group V elements such as nitrogen, phosphorus, arsenic, and antimony. The edge emitting laser including III-V semiconductors may be fabricated by epitaxially growing a stack of semiconductor layers of different compositions and dopant concentrations on a substrate. In other words, these semiconductor layers are stacked from the substrate in a direction perpendicular to the substrate. One or more n-type layers may be formed on the substrate and one or more p-type layers may be formed over the one or more n-type layers with one or more layers of an active region formed therebetween. Electrical contacts are formed to connect the n-type and the p-type regions. Laser waveguide is formed using materials with different refractive indexes to confine the light. Light feedback loop is achieved by end mirrors at the end of the cavity or distributed mirrors along the laser waveguide.

SUMMARY OF THE INVENTION

According to an aspect of the present invention, there is provided an edge emitting laser including: a substrate; a first dielectric layer disposed on the substrate; a semiconductor structure on the substrate at a first direction, extending in a second direction, and protruding from the substrate through the first dielectric layer in a third direction, perpendicular to the first and second directions; a hard mask layer disposed on top of the semiconductor structure; a first, a second and a third III-V optical layers sequentially and laterally grown on and from a sidewall of the semiconductor structure, and extending in the second direction; a cladding semiconductor layer disposed on the substrate next to the third III-V optical layer and electrically connected to the third III-V optical layer; a second dielectric layer disposed on the substrate to cover the first dielectric layer, the hard mask layer, the semiconductor structure, the cladding semiconductor layer, and the first, second and third III-V optical layers; and a first contact structure and a second contact structure disposed on and electrically connected to the semiconductor structure and the cladding semiconductor layer, respectively.

In the edge emitting laser, each of the first, second and third III-V optical layers may independently include a III-V semiconductor which includes at least one of group III elements of boron (B), gallium (Ga), aluminum (Al) and indium (In), and at least one of group V elements of nitrogen (N), phosphorus (P), arsenic (As), antimony (Sb) and bismuth (Bi). The semiconductor structure may include an n-doped semiconductor, the cladding semiconductor layer may include a p-doped semiconductor, the first III-V optical layer may include an n-doped III-V semiconductor, and the third III-V optical layer may include a p-doped III-V semiconductor. The semiconductor structure may include an n-doped silicon, the cladding semiconductor layer may include a p-doped silicon, the first III-V optical layer may include an n-doped AlGaAs, and the third III-V optical layer may include a p-doped AlGaAs. The second III-V optical layer may include a quantum well structure or multiple quantum well structures. The second III-V optical layer may include InGaAs. The first dielectric layer and the second dielectric layer may include silicon oxide. A width of the semiconductor structure in the first direction may be about 0.5 µm to about 2 µm, and a length of the semiconductor structure in the second direction may be about 100 µm to about 8000 µm. A width in the first direction for the first III-V optical layer may be about 20 nm to about 50 nm, for the second III-V optical layer may be about 5 nm to about 10 nm, and for the third III-V optical layer may be about 20 nm to about 50 nm. A width of the cladding semiconductor layer in the first direction may be about 0.5 µm to about 2 µm, and a length of the cladding semiconductor layer in the second direction may be about 100 µm to about 8000 µm. At least one of the first, second and third III-V optical layers may include a multilayer structure. The hard mask layer may include silicon oxide or silicon nitride.

According to another aspect of the present invention, there is provided an edge emitting laser including: a semiconductor structure disposed on a substrate; a first, a second and a third III-V optical layers sequentially and laterally grown on and from a sidewall of the semiconductor structure; a cladding semiconductor layer disposed next to the third III-V optical layer and electrically connected to the third III-V optical layer; and a first contact structure and a second contact structure disposed on and electrically connected to the semiconductor structure and the cladding semiconductor layer, respectively, in which each of the first, second and third III-V optical layers may independently include a III-V semiconductor including at least one of group III elements of boron (B), gallium (Ga), aluminum (Al) and indium (In), and at least one of group V elements of nitrogen (N), phosphorus (P), arsenic (As), antimony (Sb) and bismuth (Bi).

In the edge emitting laser, the semiconductor structure may include an n-doped silicon, the cladding semiconductor layer may include a p-doped silicon, the first III-V optical layer may include an n-doped AlGaAs, the second III-V optical layer may include InGaAs, the third III-V optical layer may include a p-doped AlGaAs, and the first III-V optical layer may be laterally grown on and from Si (111) crystal plane of the sidewall of the semiconductor structure.

According to another aspect of the present invention, there is provided a method for manufacturing edge emitting lasers including: providing a semiconductor substrate; forming a hard mask layer on top of the semiconductor substrate, the hard mask layer arranged in a first direction and extending in a second direction; etching the semiconductor substrate using the hard mask layer as an etching mask to form a semiconductor structure protruding above the semiconductor substrate in a third direction perpendicular to the first and second directions; forming a first dielectric layer over the semiconductor substrate, the first dielectric layer having a top surface lower than a top surface of the semiconductor structure, so as to expose sidewalls of the semiconductor structure above the first dielectric layer; implanting n-dopant or p-dopant to the semiconductor structure to form n-doped or p-doped semiconductor in the semiconductor structure; laterally growing a first III-V optical layer, a second III-V optical layer and a third III-V optical layer sequentially on and from each of the exposed sidewalls of the semiconductor structure, the first, second and third III-V optical layers extending in the second direction; forming cladding semiconductor layers directly connected to exposed sidewalls of the third III-V optical layers and extending in the second direction; forming a second dielectric layer to cover the first dielectric layer, the hard mask layer, the semiconductor structure, the cladding semiconductor layers, and the first, second and third III-V optical layers; and forming a first contact structure through the second dielectric layer and the hard mask layer to connect the semiconductor structure, and second contact structures through the second dielectric layer to connect the cladding semiconductor layers.

In the method for manufacturing edge emitting lasers, each of the first, second and third III-V optical layers may independently include a III-V semiconductor including at least one of group III elements of boron (B), gallium (Ga), aluminum (Al) and indium (In), and at least one of group V elements of nitrogen (N), phosphorus (P), arsenic (As), antimony (Sb) and bismuth (Bi). The semiconductor structure may include an n-doped silicon, the cladding semiconductor layer may include a p-doped silicon, the first III-V optical layer may include an n-doped AlGaAs, the second III-V optical layer may include InGaAs, and the third III-V optical layer may include a p-doped AlGaAs. The laterally growing of the first III-V optical layer may include selective epitaxial growth of n-doped AlGaAs on n-doped silicon sidewall. The etching of the semiconductor substrate may include etching a silicon substrate about 0.5 µm to about 2 µM deep through a wet etching process with strong alkaline substances including tetramethylammonium hydroxide. The forming of the cladding semiconductor layers may include: depositing an amorphous p-doped silicon cladding layer on the semiconductor substrate; planarizing the amorphous p-doped silicon cladding layer to expose the hard mask layer; etching back to expose the first, second, and third III-V optical layers; and patterning the amorphous p-doped silicon cladding layer to form the cladding semiconductor layers. A width of the semiconductor structure in the first direction may be about 0.5 µm to about 2 µm, and a length of the semiconductor structure in the second direction may be about 100 µM to about 8000 µm. A width in the first direction for the first III-V optical layer may be about 20 nm to about 50 nm, for the second III-V optical layer may be about 5 nm to about 10 nm, and for the third III-V optical layer may be about 20 nm to about 50 nm.

BRIEF DESCRIPTION OF THE DRAWINGS

The present invention may best be understood from the following detailed description of preferred embodiments, taken in conjunction with the accompany drawings, and in which:

FIG. 4A is a schematic cross-sectional diagram representing an n-doped semiconductor structure formed under the hard mask layer and a first dielectric layer formed on the semiconductor substrate, and FIG. 4B is a schematic top-view diagram representing the n-doped semiconductor structure formed under the hard mask layer and the first dielectric layer formed on the semiconductor substrate according to an exemplary embodiment of the present invention;

FIG. 5A is a schematic cross-sectional diagram representing a first, a second and a third III-V optical layers laterally and sequentially grown on and from each of exposed sidewalls of the semiconductor structure, and FIG. 5B is a schematic top-view diagram representing the first, second and third III-V optical layers laterally and sequentially grown on and from each of the exposed sidewalls of the semiconductor structure according to an exemplary embodiment of the present invention;

FIG. 7A is a schematic cross-sectional diagram representing a second dielectric layer formed to cover the formed layers and structure, and a first contact structure formed to connect the semiconductor structure and second contact structures formed to connect the p-doped cladding semiconductor layers, and FIG. 7B is a schematic top-view diagram representing the second dielectric layer formed to cover the formed layers and structure, and the first contact structure formed to connect the semiconductor structure and the second contact structures formed to connect the p-doped cladding semiconductor layers according to an exemplary embodiment of the present invention.

Figure 1:
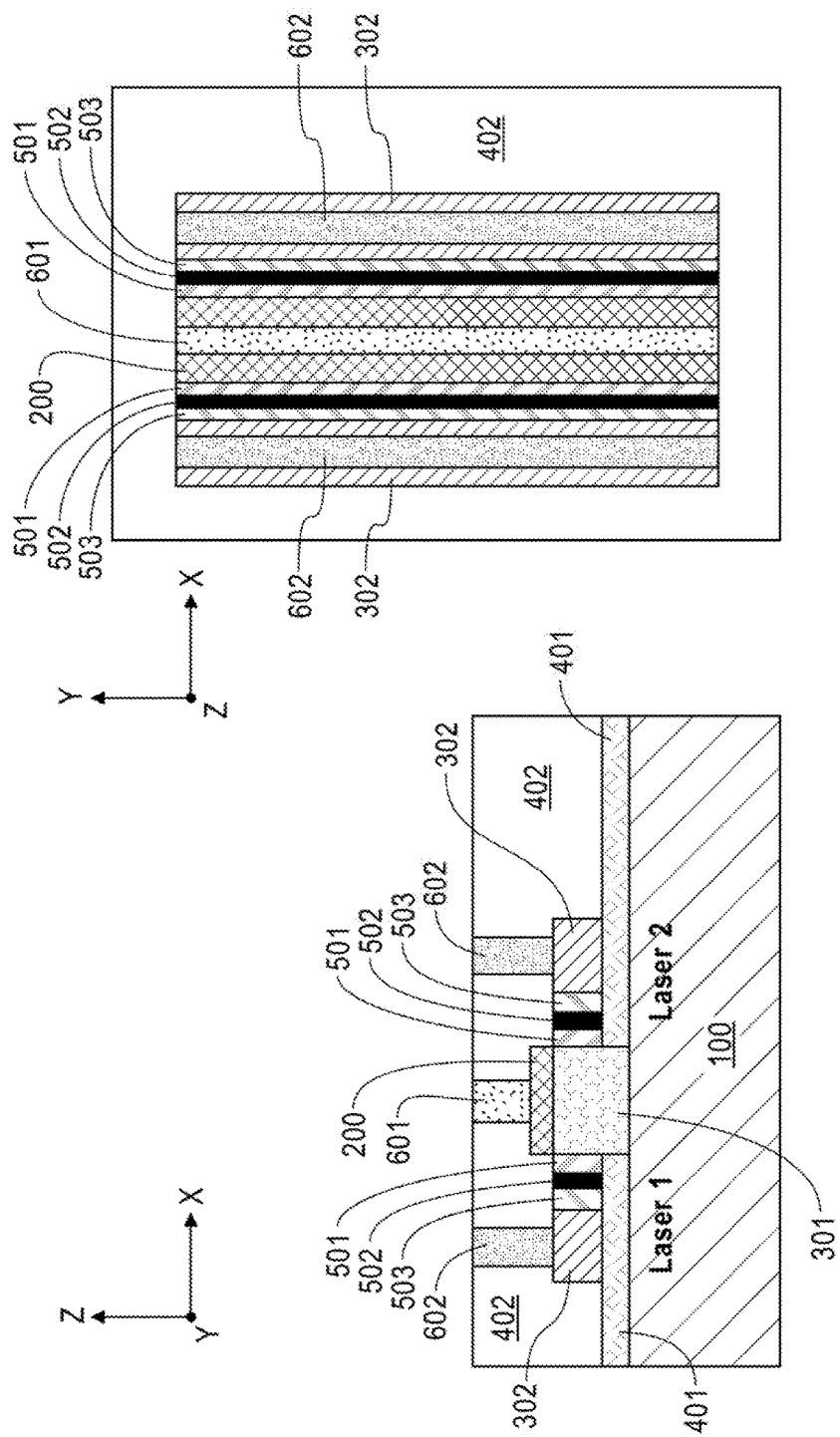
FIG. 1A is a schematic cross-sectional diagram representing a laterally grown edge emitting laser on a substrate.
FIG. 1B is a schematic top-view diagram representing the laterally grown edge emitting laser on the substrate according to an exemplary embodiment of the present invention.

Since the drawings in FIGS. 1-7 are intended for illustrative purpose, the elements in the drawings are not necessarily drawn to scale. For example, some of the elements may be enlarged or exaggerated for clarity purpose.

DETAILED DESCRIPTION OF PREFERRED EMBODIMENTS

This invention relates generally to an edge emitting laser and a method of manufacturing the edge emitting laser. Specifically, the present invention relates to a laterally grown edge emitting laser and a method of manufacturing the same. More specifically, the edge emitting laser is formed by laterally growing III-V semiconductors on a sidewall of a semiconductor structure. A metal-oxide-semiconductor field-effect transistor (MOSFET) may be grown on a sidewall of a semiconductor structure, for example, on a sidewall of silicon. Exemplary embodiments of the present invention provide that an edge emitting laser may be grown on a sidewall of a semiconductor structure so that it can be integrated with the MOSFET, and also provide a method of forming the edge emitting laser by laterally growing III-V semiconductors on the sidewall of the semiconductor structure.

It will be understood that when an element such as a layer, region or substrate is referred to as being "on" or "over" another element, it can be directly on or over the other element or intervening elements may also be present. In contrast, when an element is referred to as being "directly on" or "directly over" another element, there are no intervening elements present. As used herein, the singular forms "a", "an" and "the" are intended to include the plural forms as well, unless the context clearly indicates otherwise.

One embodiment of the present invention may include an edge emitting laser laterally grown on a semiconductor structure over a substrate as shown in FIGS. 1A and 1B. FIG. 1A is a schematic cross-sectional diagram representing the laterally grown edge emitting laser on the substrate, and FIG. 1B is a schematic top-view diagram representing the laterally grown edge emitting laser on the substrate according to an exemplary embodiment of the present invention. In FIG. 1B, the layers under the dielectric layer are shown for the purpose of providing better understanding of the structure of the edge emitting laser. Referring to FIGS. 1A and 1B, the edge emitting laser may include: a substrate 100; a first dielectric layer 401 disposed on the substrate 100; a semiconductor structure 301 disposed on the substrate 100 at a first direction, X direction, extending in a second direction, Y direction, and protruding from the substrate 100 through the first dielectric layer 401 in a third direction, Z direction, perpendicular to the first and second directions; a hard mask layer 200 disposed on top of the semiconductor structure 301; a first, a second and a third III-V optical layers 501, 502 and 503 sequentially and laterally grown on and from a sidewall of the semiconductor structure 301, and extending in the second direction; a cladding semiconductor layer 302 disposed on the substrate 100 next to the third III-V optical layer 503 and electrically connected to the III-V optical layer 503; a second dielectric layer 402 disposed on the substrate 100 to cover the first dielectric layer 401, the hard mask layer 200, the semiconductor structure 301, the cladding semiconductor layer 302, and the first, second and third III-V optical layers 501, 502 and 503; a first contact structure 601 and a second contact structure 602 disposed on and electrically connected to the semiconductor structure 301 and the cladding semiconductor layer 302, respectively.

The substrate 100 may be any suitable substrate and may include a semiconducting material, such as, for example, silicon (Si), germanium (Ge), silicon germanium (SiGe), silicon carbide (SiC), gallium nitride (GaN) or gallium arsenide (GaAs), a non-semiconducting material such as, for example, silicon oxide ($SiO_2$), aluminum (Al), aluminum oxide ($Al_2O_3$), ceramic, quartz, or copper (Cu), or any combination thereof, including multilayers, for example, germanium on silicon, or silicon on insulator (SOI). For some applications, the substrate 100 may be a semiconductor substrate doped with impurities to render them p-type or n-type. In a p-doped silicon substrate, the Si substrate may be doped with p-type dopants such as, for example, boron (B), aluminum (Al), gallium (Ga) and indium (In). In an n-doped silicon substrate, the Si substrate may be doped with n-type dopants such as, for example, antimony (Sb), arsenic (As) and phosphorous (P). The preferable substrate material for the substrate 100 is silicon.

The first dielectric layer 401 may be disposed on the substrate 100 to cover the substrate 100. The first dielectric layer 401 may function as an insulating layer to isolate the substrate 100, especially when it is a semiconductor substrate or a conductor substrate, from the laser components thereabove. The thickness of the first dielectric layer 401 may be in a range from about 5 nm to about 200 nm, for example, may be in a range from about 50 nm to about 100 nm. The first dielectric layer 401 may include tetraethyl orthosilicate (TEOS), silicon nitride ($Si_3N_4$), silicon oxide ($SiO_2$), silicon oxynitride (SiON), nanoporous silica, hydrogensilsesquioxanes (HSQ), Teflon-AF (polytetrafluorethylene or PTFE), silicon oxyfluoride (FSG), carbon doped $SiO_2$ (SiCO), hydrogenated silicon oxycarbide (SiCOH), or other low k dielectric materials. The preferable material for the first dielectric layer 401 is $SiO_2$.

The semiconductor structure 301 may be disposed on the substrate 100 for lateral growth of the edge emitting laser and for electrode, for example, cathode, connection at a first direction, X direction, extending in a second direction, Y direction, and may protrude from the substrate 100 through the first dielectric layer 401 in a third direction, Z direction, perpendicular to the first and second directions. The semiconductor structure 301 may be protruding from the substrate 100 with a height from about 0.5 µm to about 2.0 µM. The semiconductor structure 301 may have a width in the first direction, X direction, from about 0.5 µm to about 2.0 µm and a length in the second direction, Y direction, from about 100 µM to about 8000 µm. The semiconductor structure 301 may include an n-doped semiconductor, for example, Si doped with antimony (Sb), arsenic (As) and/or phosphorous (P), and the n-doped semiconductor may be heavily doped such as, for example, n+-Si. Other suitable n-doped semiconductor may also be used to form the semiconductor structure 301. The semiconductor structure 301 may include a single crystal silicon. Although the sidewall of the semiconductor structure 301 may have many crystallographic orientations of Si, it is preferable that the sidewall of the semiconductor structure 301 is Si (111) crystal plane.

The hard mask layer 200 may be disposed on top of the semiconductor structure 301 as an etching mask for an etching process in forming the edge emitting laser, and to cover the top surface of the semiconductor structure to prevent any top growth of III-V semiconductors on top of the semiconductor structure 301. The hard mask layer 200 may include silicon oxide ($SiO_2$), silicon nitride ($Si_3N_4$), boron nitride (BN), metal, metal nitride, and/or metal oxide and may have a thickness in a range from about 10 nm to about 100 nm. The hard mask layer 200 may have its shape and size the same as those of the semiconductor structure 301 in the X-Y plan, and may have a width in the first direction, X direction, from about 0.5 µm to about 2.0 µm and a length in the second direction, Y direction, from about 100 µM to about 8000 µm. The preferable material for the first dielectric layer 401 is silicon oxide ($SiO_2$) or silicon nitride ($Si_3N_4$).

The first, second and third III-V optical layers 501, 502 and 503 may be sequentially and laterally grown on and from a sidewall of the semiconductor structure 301, and may extend in the second direction, Y direction. Each of the first, second and third III-V optical layers 501, 502 and 503 may independently include a III-V semiconductor which includes at least one of group III elements of boron (B), gallium (Ga), aluminum (Al) and indium (In), and at least one of group V elements of nitrogen (N), phosphorus (P), arsenic (As), antimony (Sb) and bismuth (Bi). For example, the III-V semiconductor may be a binary, ternary, or quaternary alloy including at least one of group III elements and at least one of group V elements. The binary alloy may be, for example, one of GaAs, GAN, GaP, InP, InAs, InSb, and GaSb. The ternary alloy may be, for example, one of AlGaAs, InGaAs, InGaP, InGaSb, GaAsSb, AlInAs, AlInSb, AlGaP, InAsSb, GaAsP, InGaN, and AlGaN. The quaternary alloy may be, for example one of InGaAlP, AlGaAsSb, AlGaPSb, InGaAlSb, and AlGaPAs. The first III-V optical layer 501 may include an n-doped III-V semiconductor, and the third III-V optical layer 503 may include a p-doped III-V semiconductor. For example, the first III-V optical layer 501 may include an n-doped AlGaAs, and the third III-V optical layer 503 may include a p-doped AlGaAs. They may be heavily doped, for example, the first III-V optical layer 501 may include an AlGaAs n+, and the third III-V optical layer 503 may include a AlGaAs p+. The first III-V optical layer 501 is laterally grown from the sidewall of the semiconductor structure 301 and is directly connected to the semiconductor structure 301. The second III-V optical layer 502 may be laterally grown on the sidewall of the first III-V optical layer 501. The third III-V optical layer 503 may be laterally grown on the sidewall of the second III-V optical layer 502, with the second III-V optical layer 502 interposed between the first III-V optical layer 501 and the third III-V optical layer 503. When the second III-V optical layer 502 containing a material having a smaller bandgap energy is interposed between the first and third III-V optical layers 501 and 503 containing materials having higher energy gaps, a double heterojunction is formed. A double heterojunction consists of two heterojunctions, and the recombination of carriers is restricted to the low bandgap region, for example, in the second III-V optical layer 502. The low bandgap region may be called active region, and the second III-V optical layer 502 may include GaAs. In addition, the second III-V optical layer 502 may include a thin quantum well structure or multiple quantum well structures. The second III-V optical layer may include InGaAs. A width in the first direction, X direction, for the first III-V optical layer 501 may be from about 20 nm to about 50 nm, for the second III-V optical layer 502 may be from about 5 nm to about 10 nm, and for the third III-V optical layer 503 may be from about 20 nm to about 50 nm. In an exemplary embodiment of the present invention, at least one of the first, second and third III-V optical layers 501, 502 and 503 may include a multilayer structure. For example, the second III-V optical layer 502 including InGaAs quantum well structure may be centered between two layers of graded-index separate confinement AlGaAs heterostructure (n-graded AlGaAs layer and p-graded AlGasAs layer on each side) to serve as the high refractive index core of the optical waveguide. The low refractive index cladding layers of AlGaAs n+ layer and AlGaAs p+ layer may be deposited on both n and p sides to provide a symmetric positive refractive index waveguide.

The cladding semiconductor layer 302 as an outer layer for electrode, for example, anode, connection may be disposed on the substrate 100 next to the third III-V optical layer 503 and electrically connected to the III-V optical layer 503. Both the first III-V optical layer 501 and the third III-V optical layer 503 may be used for the outer layers of the edge emitting laser, and the second III-V optical layer 502 having smaller band gap may be used for the inner layer. Thus, there are two junctions (or boundaries), one at each side of the inner layer to form a double heterojunction. The cladding semiconductor layer 302 may include a p-doped semiconductor material, for example, Si doped with boron (B), aluminum (Al), gallium (Ga) and indium (In), and the p-doped semiconductor may be heavily doped such as, for example, p+-Si. Thus, the cladding semiconductor layer 302 is a p-doped cladding semiconductor layer. Other suitable p-doped semiconductors may also be used to form the cladding semiconductor layer 302. The cladding semiconductor layer 302 may include a p-doped amorphous Si. A width of the cladding semiconductor layer 302 in the first direction may be from about 0.5 µm to about 2 µm, and a length of the cladding semiconductor layer in the second direction may be from about 100 µm to about 8000 µm. When the semiconductor structure 301 is n+-Si and the cladding semiconductor layer is p+-Si, both may function as part of waveguide to confine the laser light.

The second dielectric layer 402 for sealing the edge emitting laser may be disposed on the substrate 100 to cover the first dielectric layer 401, the hard mask layer 200, the semiconductor structure 301, the cladding semiconductor layer 302, and the first, second and third III-V optical layers 501, 502 and 503. The second dielectric layer 402 may include tetraethyl orthosilicate (TEOS), silicon nitride ($Si_3N_4$), silicon oxide ($SiO_2$), silicon oxynitride (SiON), nanoporous silica, hydrogensilsesquioxanes (HSQ), Teflon-AF (polytetrafluorethylene or PTFE), silicon oxyfluoride (FSG), carbon doped $SiO_2$ (SiCO), hydrogenated silicon oxycarbide (SiCOH), or other low k dielectric materials. The first and second dielectric layers 401 and 402 may be formed of the same material and may be integrated to form one dielectric layer to seal the edge emitting laser. The preferable material for the second dielectric layer 402 is $SiO_2$.

The first contact structure 601 and the second contact structure 602 may allow pumping electrical current through the edge emitting laser, and may be disposed on and electrically connected to the semiconductor structure 301 and the cladding semiconductor layer 302, respectively. The first contact structure 601 and the second contact structure 602 may each include, for example, gold (Au), titanium (Ti), copper (Cu), silver (Ag), Aluminum (Al), tungsten (W), cobalt (Co), Chromium (Cr), molybdenum (Mo), zirconium (Zr), nickel (Ni), tantalum (Ta), platinum (Pt), or an alloy thereof.

In an exemplary embodiment of the present invention, the hard mask layer 200, the first dielectric layer 401 and the second dielectric layer 402 may be formed of the same material, for example, silicon oxide ($SiO_2$), and may be integrated to form one dielectric layer to seal the edge emitting laser. In addition, the hard mask layer 200 may be removed during a planarization process, and may not be included in the final edge emitting laser structure.

The semiconductor structure 301 may be p-doped instead of n-doped. In an exemplary embodiment of the present invention, the semiconductor structure 301 may include a p-doped semiconductor, for example, a p-doped silicon, the cladding semiconductor layer 302 may include an n-doped semiconductor, for example, an n-doped silicon, the first III-V optical layer 501 may include a p-doped III-V semiconductor, for example, a p-doped AlGaAs, the second III-V optical layer 502 may include an undoped III-V semiconductor, for example, InGaAs, and the third III-V optical layer 503 may include an n-doped III-V semiconductor, for example, an n-doped AlGaAs.

Figure 2:
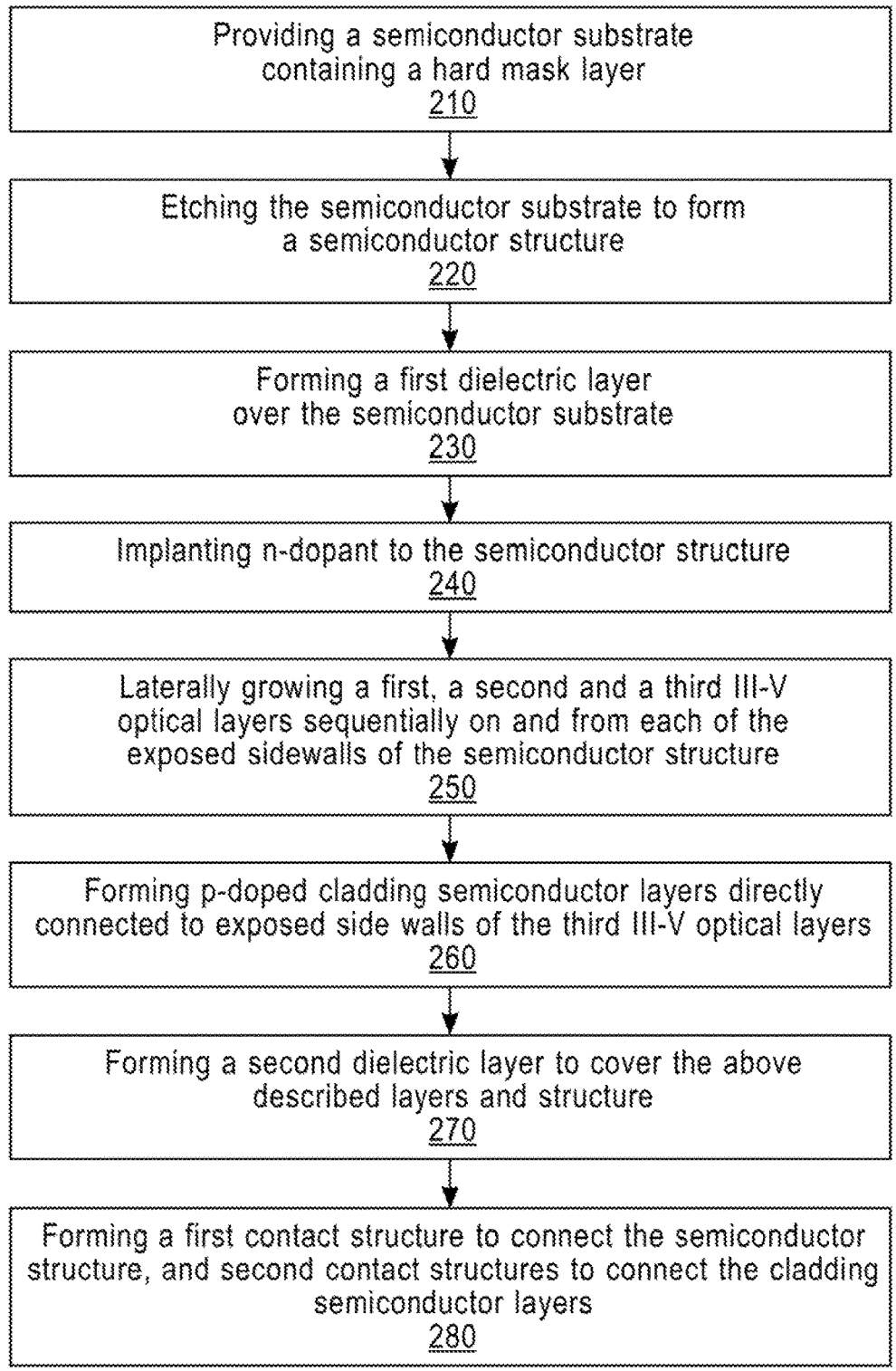
FIG. 2 is a flow chart of a method for making edge emitting lasers on a semiconductor substrate according to an exemplary embodiment of the present invention.

According to an exemplary embodiment of the present invention, a method for manufacturing edge emitting lasers may include the following steps: providing a semiconductor substrate; forming a hard mask layer on top of the semiconductor substrate, the hard mask layer arranged in a first direction, and extending in a second direction; etching the semiconductor substrate using the hard mask layer as an etching mask to form a semiconductor structure protruding above the semiconductor substrate in a third direction, perpendicular to the first and second directions; forming a first dielectric layer over the semiconductor substrate, the first dielectric layer having a top surface lower than a top surface of the semiconductor structure, so as to expose sidewalls of the semiconductor structure above the first dielectric layer; implanting n-dopant to the semiconductor structure to form n-doped semiconductor in the semiconductor structure; laterally growing a first III-V optical layer, a second III-V optical layer and a third III-V optical layer sequentially on and from each of the exposed sidewalls of the semiconductor structure, the first, second and third III-V optical layers extending in the second direction; forming p-doped cladding semiconductor layers directly connected to exposed sidewalls of the third III-V optical layers and extending in the second direction; forming a second dielectric layer to cover the first dielectric layer, the hard mask layer, the semiconductor structure, the p-doped cladding semiconductor layer, and the first, second and third III-V optical layers; and forming a first contact structure through the second dielectric layer and the hard mask layer to connect the semiconductor structure, and second contact structures through the second dielectric layer to connect the p-doped cladding semiconductor layers. The sequence of the steps as described above is preferred. However, the invention is not limited to the performance of these steps with the sequence or order presented above. Many steps may also be applied to the semiconductor substrate before, between or after the steps shown above. FIG. 2 is a flow chart of a method for making edge emitting lasers on a semiconductor substrate according to an exemplary embodiment of the present invention. FIGS. 3A-7A and FIGS. 3B-7B are demonstrative illustrations of cross-sectional views or top views of structures in the method of manufacturing the edge emitting laser according to an exemplary embodiment of the present invention.

Figure 3B:
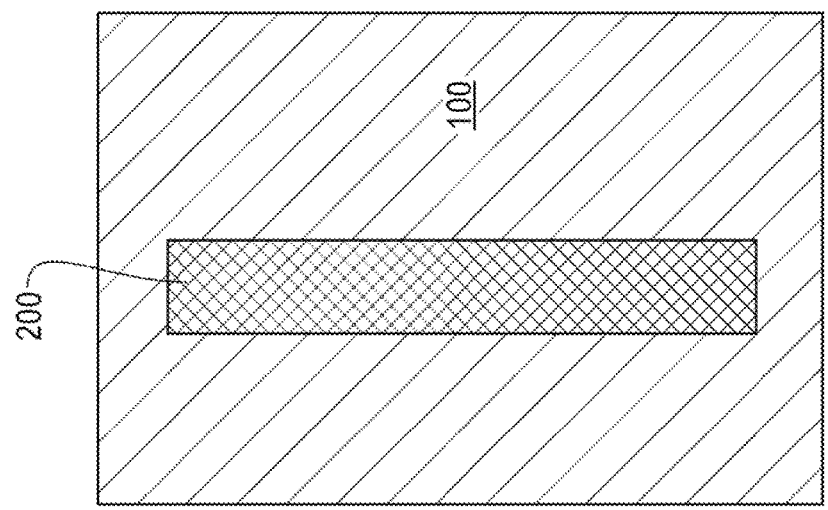
FIG. 3B is a schematic top-view diagram representing the hard mask layer formed on the semiconductor substrate according to an exemplary embodiment of the present invention.
Figure 3A:
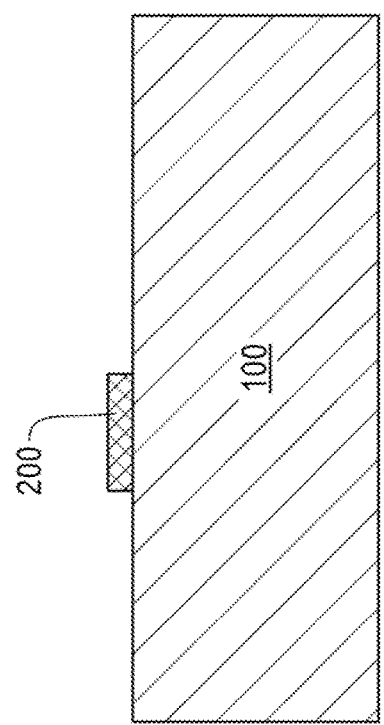
FIG. 3A is a schematic cross-sectional diagram representing a hard mask layer formed on a semiconductor substrate.

At block 210 of FIG. 2, a semiconductor substrate containing a hard mask layer is provided. Referring to FIGS. 3A and 3B, a hard mask layer 200 may be formed on top of a semiconductor substrate 100 at a first direction, X direction, and may extend in a second direction, Y direction, with a height in the third direction, Z direction, perpendicular to the first and second directions. The semiconductor substrate 100 may be a silicon (Si) substrate, a germanium (Ge) substrate, a silicon germanium (SiGe) substrate, a silicon carbide (SiC) substrate, a gallium nitride (GaN) substrate, a gallium arsenide (GaAs) substrate, a silicon on insulator (SOI) substrate, or any other commonly used semiconductor substrate. The semiconductor substrate 100 may include one or more semiconductor layers or structures and may include active or operable portions of semiconductor devices. The hard mask layer 200 may include silicon oxide ($SiO_2$), silicon nitride ($Si_3N_4$), boron nitride (BN), metal, metal nitride, and/or metal oxide and may have a thickness, the height, in a range from about 10 nm to about 100 nm. The hard mask layer 200 may have a width in the first direction, X direction, from about 0.5 μm to about 2.0 μm and a length in the second direction, Y direction, from about 100 to about 8000 μm. The hard mask layer 200 may be formed on the semiconductor substrate 100 with various deposition processes include, but are not limited to: physical vapor deposition (PVD), chemical vapor deposition (CVD), atomic layer deposition (ALD), electrochemical deposition (ECD), electroplating, electroless plating and spin coating. The preferable method is PVD, such as sputtering, or CVD.

At block 220 of FIG. 2, the semiconductor substrate 100 may be etched to form a semiconductor structure. Referring to FIGS. 4A and 4B, the semiconductor substrate 100 may be etched using the hard mask layer as an etching mask to form a semiconductor structure 301 protruding above the semiconductor substrate 100 in the third direction, Z direction, perpendicular to the first and second directions. The semiconductor structure 301 may be etched to a depth of about 0.5 μm to about 2.0 μm. The semiconductor structure 301 may have a shape in the X-Y plane similar to that of the hard mask layer 200, and may have a width in the first direction, X direction, from about 0.5 μm to about 2.0 μm and a length in the second direction, Y direction, from about 100 μm to about 8000 μM. The etch process used for forming the semiconductor structure 301 may be any conventional reactive ion etching (RIE) processes using different etchants to etch the semiconductor substrate 100. The etchant or etchants may contain fluorine. In a preferred embodiment, the semiconductor substrate 301 is a silicon substrate. Many etchants may be used to etch the silicon substrate. For example, an HBr dry etch may be used to remove silicon of the semiconductor substrate 100 selective to the hard mask materials of the hard mask layer 200. The silicon etch process may also use etchants such as: $Cl_2/HBr/CF_4/O_2$, and/or $HBr/O_2$. Wet etch process may also be used in etching the semiconductor substrate 100. For example, strong alkaline substance such as aqueous KOH or TMAH solution may be used to etch silicon substrate. Since the bonding energy of Si atoms is different for each crystal plane, the etch rate by KOH or TMAH solution may be different at each crystal plane. Thus, the Si etch by KOH or TMAH solution may be highly anisotropic. In an example embodiment of the present invention, the semiconductor substrate 100 may be wet etched by KOH or TMAH solution on the Si (110) crystal plane of the semiconductor substrate 100 to form the semiconductor structure 301 with sidewalls at Si (111) crystal plane. The preferable etch method is wet etch with TMAH solution.

At block 230 of FIG. 2, a first dielectric layer may be formed over the semiconductor substrate 100. Referring to FIGS. 4A and 4B, a first dielectric layer 401 may be formed over the semiconductor substrate 100, and the first dielectric layer 401 may have a top surface lower than a top surface of the semiconductor structure 100 so as to expose sidewalls of the semiconductor structure 301 above the first dielectric layer 401. The thickness of the first dielectric layer 401 may be in a range from about 5 nm to about 200 nm, for example, may be in a range from about 50 nm to about 100 nm. The first dielectric layer 401 may include tetraethyl orthosilicate (TEOS), silicon nitride ($Si_3N_4$), silicon oxide ($SiO_2$), silicon oxynitride (SiON), nanoporous silica, hydrogensilsesquioxanes (HSQ), Teflon-AF (polytetrafluorethylene or PTFE), silicon oxyfluoride (FSG), carbon doped $SiO_2$ (SiCO), hydrogenated silicon oxycarbide (SiCOH), or other low k dielectric materials. The preferable material for the first dielectric layer 401 is $SiO_2$. The first dielectric layer 401 may be formed on the semiconductor substrate 100 with various deposition processes include, but are not limited to: physical vapor deposition (PVD), chemical vapor deposition (CVD), atomic layer deposition (ALD), and spin coating. The preferable method is PVD, such as sputtering, or CVD.

At block 240 of FIG. 2, n-dopant may be implanted to the semiconductor structure 301. Referring to FIGS. 4A and 4B, n-dopant may be implanted to the semiconductor structure 301 to form n-doped semiconductor in the semiconductor structure 301. The n-doped semiconductor may be Si doped with antimony (Sb), arsenic (As) and/or phosphorous (P), and the n-doped semiconductor may be heavily doped such as, for example, n+-Si. During the ion implantation process, a mask layer, for example, a photoresist, may be formed to cover the rest of the substrate except the area above the semiconductor structure 301. In the ion implantation process, ions are implanted at a high enough energy and dose into the semiconductor structure 301 to create the n+-Si region. In some instances, a tilted angle ion implantation process may be used to implant the n-dopant to the semiconductor structure 301.

At block 250 of FIG. 2, a first, a second and a third III-V optical layers may be laterally and sequentially grown on and from each of the exposed sidewalls of the semiconductor structure 301. Referring to FIGS. 5A and 5B, a first III-V optical layer 501, a second III-V optical layer 502 and a third III-V optical layer 503 may be laterally and sequentially grown on and from each of the exposed sidewalls of the semiconductor structure 301, and the first, second and third III-V optical layers 501, 502 and 503 may extend in the second direction, Y direction. Each of the first, second and third III-V optical layers 501, 502 and 503 may independently include a III-V semiconductor which includes at least one of group III elements of boron (B), gallium (Ga), aluminum (Al) and indium (In), and at least one of group V elements of nitrogen (N), phosphorus (P), arsenic (As), antimony (Sb) and bismuth (Bi). The first III-V optical layer 501 may include an n-doped III-V semiconductor, and the third III-V optical layer 503 may include a p-doped III-V semiconductor. For example, the first III-V optical layer 501 may include an n-doped AlGaAs, and the third III-V optical layer 503 may include a p-doped AlGaAs. They may be heavily doped, for example, the first III-V optical layer 501 may include an AlGaAs n+, and the third III-V optical layer 503 may include a AlGaAs p+. Each of the first III-V optical layers 501 may be laterally grown on and from each of the sidewalls of the semiconductor structure 301 and may be directly connected to the semiconductor structure 301. For example, the AlGaAs n+ material may be grown on Si (111) crystal plane of the n+-Si material. Each of the second III-V optical layers 502 may be laterally grown on each of the exposed sidewalls of the first III-V optical layer 501. Each of the third III-V optical layers 503 may be laterally grown on each of the exposed sidewalls of the second III-V optical layers 502, with the second III-V optical layer 502 interposed between the first III-V optical layer 501 and the third III-V optical layer 503. The second III-V optical layer 502 may include a thin quantum well structure or multiple quantum well structures. The second III-V optical layer may include InGaAs. A width in the first direction for the first III-V optical layer 501 may be from about 20 nm to about 50 nm, for the second III-V optical layer 502 may be from about 5 nm to about 10 nm, and for the third III-V optical layer 503 may be from about 20 nm to about 50 nm. In an exemplary embodiment of the present invention, at least one of the first, second and third III-V optical layers 501, 502 and 503 may include a multilayer structure. Many processes may be used to grow III-V semiconductor materials on silicon surface, and may include, for example, metal organic chemical vapor deposition (MOCVD) process and molecular beam epitaxy (MBE) process. Many different III-V compounds may be laterally grown on the semiconductor structure 301, and may include various metal organic precursors such as, for example, trimethylgallium, trimethylaluminum, trimethylindium, tertiarybutylarsine and tertiarybutylphosphine. It is preferable that the III-V semiconductors are laterally, selectively, and epitaxially grown on Si (111) crystal plane sidewalls of the semiconductor structure 301. The growth of the III-V semiconductors may only be occurred along the sidewalls (Y-Z plane) extending in the second direction, Y direction. The sidewalls on each end (X-Z plane) may be blocked with oxide mask.

Figure 6B:
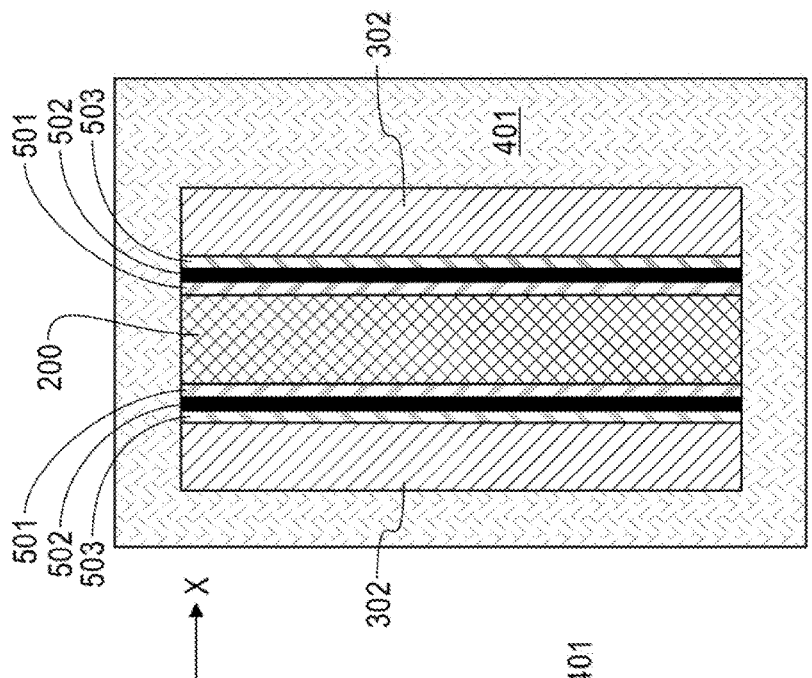
FIG. 6B is a schematic top-view diagram representing the p-doped cladding semiconductor layers formed and directly connected to the exposed sidewalls of the third III-V optical layers according to an exemplary embodiment of the present invention.
Figure 6A:
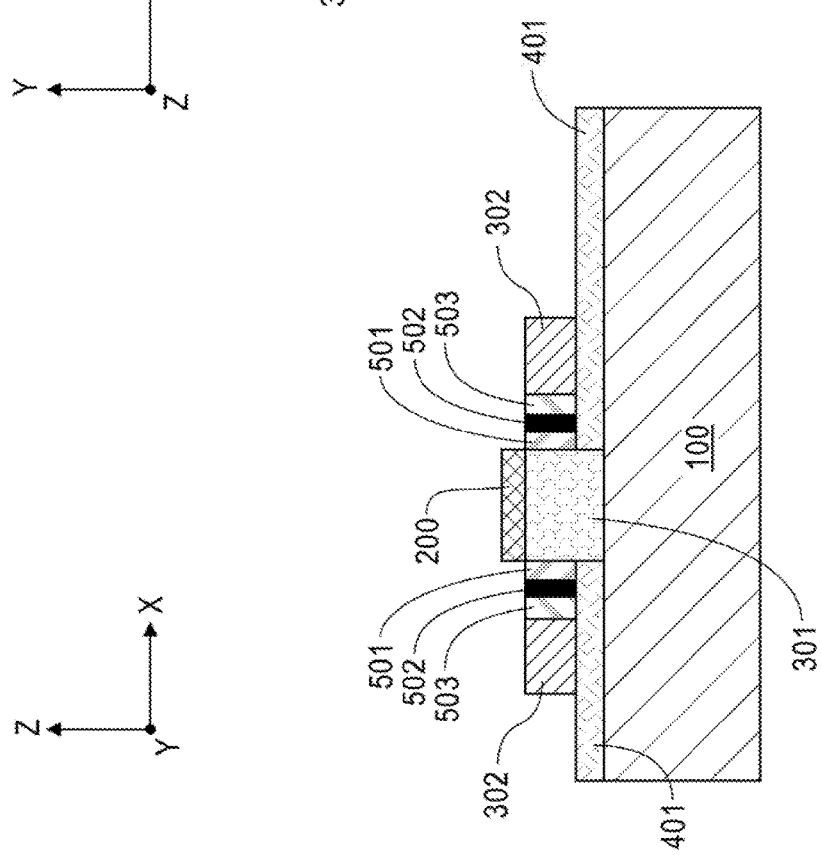
FIG. 6A is a schematic cross-sectional diagram representing p-doped cladding semiconductor layers formed and directly connected to exposed sidewalls of the third III-V optical layers.

At block 260 of FIG. 2, p-doped cladding semiconductor layers may be formed and directly connected to exposed sidewalls of the third III-V optical layers 503. Referring to FIGS. 6A and 6B, p-doped cladding semiconductor layers 302 may be formed and directly connected to exposed sidewalls of the third III-V optical layers 503, and may extend in the second direction, Y direction. The p-doped cladding semiconductor layer 302 may include a p-doped semiconductor material, for example, Si doped with boron (B), aluminum (Al), gallium (Ga) and indium (In), and the p-doped semiconductor may be heavily doped such as, for example, p+-Si. The p-doped cladding semiconductor layer 302 may include a p-doped amorphous Si. A width of the p-doped cladding semiconductor layer 302 in the first direction, X direction, may be from about 0.5 µm to about 2 µm, and a length of the p-doped cladding semiconductor layer 302 in the second direction, Y direction, may be from about 100 µm to about 8000 µm. Various methods may be used to deposit the p-doped cladding semiconductor layers 302. An amorphous silicon film is usually deposited by chemical vapor deposition (CVD) such as plasma enhanced CVD (PECVD). The formation of the p-doped cladding semiconductor layers 302 may include the following steps: depositing an amorphous p-doped silicon cladding layer on the semiconductor substrate 100, for example, by PECVD; planarizing the amorphous p-doped silicon cladding layer to expose the hard mask layer 200, for example, by chemical mechanical polishing (CMP); etching back to expose the first, second, and third III-V optical layers, for example, by reactive ion etching (RIE); and patterning the amorphous p-doped silicon cladding layer to form the p-doped cladding semiconductor layer, for example, through a photolithographic process and an etching process. The amorphous silicon may be etched by RIE with etchants such as: $Cl_2$/$HBr/CF_4/O_2$, and/or $HBr/O_2$. The sequence of the steps as described above is preferred. However, the invention is not limited to the performance of these steps with the sequence or order presented above. In an example embodiment of the present invention, during the planarization of the amorphous p-doped silicon, the hard mask layer 200 may be removed to expose the top surface of the semiconductor structure 301 and the top surfaces of the first, second and third III-V optical layers. In this case, no etching back process may be used after the planarization process and before the patterning process.

At block 270 of FIG. 270, a second dielectric layer may be formed to cover the above described layers and structure. Referring to FIGS. 7A and 7B, a second dielectric layer 402 may be formed to cover the first dielectric layer 401, the hard mask layer 200, the semiconductor structure 301, the p-doped cladding semiconductor layer 302, and the first, second and third III-V optical layers 501, 502 and 503. In FIG. 7B, the layers under the second dielectric layer 402 are shown for the purpose of providing better understanding of the structure of the edge emitting laser. The second dielectric layer 402 may include tetraethyl orthosilicate (TEOS), silicon nitride ($Si_3N_4$), silicon oxide ($SiO_2$), silicon oxynitride (SiON), nanoporous silica, hydrogensilsesquioxanes (HSQ), Teflon-AF (polytetrafluorethylene or PTFE), silicon oxyfluoride (FSG), carbon doped $SiO_2$ (SiCO), hydrogenated silicon oxycarbide (SiCOH), or other low k dielectric materials. The first and second dielectric layers 401 and 402 may be formed of the same material and may be integrated to form one dielectric layer to seal the edge emitting laser. The second dielectric layer 402 may be formed with various deposition processes include, but are not limited to: physical vapor deposition (PVD), chemical vapor deposition (CVD), atomic layer deposition (ALD), and spin coating. The preferable method is PVD, such as sputtering, or CVD. The formation of the second dielectric layer 402 may also include a planarization process, for example, chemical mechanical polishing (CMP) process to form flat top surface after the deposition process.

At block 280 of FIG. 2, a first contact structure may be formed to connect the semiconductor structure 301, and second contact structures may be formed to connect the p-doped cladding semiconductor layers 302. Referring to FIGS. 7A and 7B, a first contact structure 601 may be formed through the second dielectric layer 402 and the hard mask layer 200 to connect the semiconductor structure 301, and second contact structures 602 may be formed through the second dielectric layer 402 to connect the p-doped cladding semiconductor layers 302. The first contact structure 601 and the second contact structures 602 may each include, for example, gold (Au), titanium (Ti), copper (Cu), silver (Ag), Aluminum (Al), tungsten (W), cobalt (Co), Chromium (Cr), molybdenum (Mo), zirconium (Zr), nickel (Ni), tantalum (Ta), platinum (Pt), or an alloy thereof. The formation of the first contact structure 601 and the second contact structures 602 may include a step of etching contact holes through the second dielectric layer 402 and hard mask layer 200 to expose the top surfaces of the semiconductor structure 301 and the p-doped cladding semiconductor layers, and followed by a step of filling these contact holes with conductive material. To form contact holes, a suitable reactive ion etching (RIE) method for etching dielectric layer and hard mask layer may be used to etch the second dielectric layer 402 and hard mask layer 200. A conductive material may be formed to fill the contact holes with various deposition processes include, but are not limited to: physical vapor deposition (PVD), chemical vapor deposition (CVD), atomic layer deposition (ALD), electrochemical deposition (ECD), electroplating, electroless plating and spin coating.

As shown in FIGS. 7A and 7B, two lasers, Laser 1 and Laser 2, are each formed at each side of the semiconductor structure 301. The figures also show two laser lights propagate in parallel mainly within the first, second and third III-V optical layers along the second direction, Y direction. In some instances, one sidewall of the semiconductor structure may be blocked, for example, by a silicon oxide mask, then only one laser may be laterally grown on the remaining exposed sidewall of the semiconductor structure 301.

As described above at block 240 of FIG. 2, n-dopant may be implanted to the semiconductor structure 301. However, alternatively, p-dopant may be implanted to the semiconductor structure 301. Then, the p-doped cladding semiconductor layers 302 may be replaced with n-doped cladding semiconductor layers. Thus, the first III-V optical layer 501 may include a p-doped III-V semiconductor, for example, a p-doped AlGaAs, the second III-V optical layer 502 may include an undoped III-V semiconductor, for example, InGaAs, and the third III-V optical layer 503 may include an n-doped III-V semiconductor, for example, an n-doped AlGaAs.

As described above, exemplary embodiments of the present invention provide an edge emitting laser laterally grown on a sidewall of a semiconductor structure, and also provide a method of forming the edge emitting laser by laterally growing III-V semiconductors on the sidewall of the semiconductor structure. The laterally grown edge emitting laser may be integrated with the MOSFET which may also be laterally grown on a sidewall of a semiconductor structure.

Although illustrative embodiments of the present invention have been described in detail, it should be understood that the present invention is not intended to be limited to the specific embodiments disclosed. Based on the foregoing disclosure, those skilled in the art will be able to make various changes, substitutions and alterations without departing from the spirit and scope of the present invention as defined by the following appended claims.

What is claimed is:

1. An edge emitting laser comprising:
a substrate;
a first dielectric layer disposed on the substrate;
a semiconductor structure on the substrate at a first direction, extending in a second direction, and protruding from the substrate through the first dielectric layer in a third direction, perpendicular to the first and second directions;
a hard mask layer disposed on top of the semiconductor structure;
a first, a second and a third III-V optical layers sequentially and laterally grown on and from a sidewall of the semiconductor structure, and extending in the second direction;
a cladding semiconductor layer disposed on the substrate next to the third III-V optical layer and electrically connected to the third III-V optical layer;
a second dielectric layer disposed on the substrate to cover the first dielectric layer, the hard mask layer, the semiconductor structure, the cladding semiconductor layer, and the first, second and third III-V optical layers; and
a first contact structure and a second contact structure disposed on and electrically connected to the semiconductor structure and the cladding semiconductor layer, respectively.

2. The edge emitting laser of claim 1, wherein each of the first, second and third III-V optical layers independently comprises a III-V semiconductor including at least one of group III elements of boron (B), gallium (Ga), aluminum (Al) and indium (In), and at least one of group V elements of nitrogen (N), phosphorus (P), arsenic (As), antimony (Sb) and bismuth (Bi).

3. The edge emitting laser of claim 1, wherein the semiconductor structure comprises an n-doped semiconductor, the cladding semiconductor layer comprises a p-doped semiconductor, the first III-V optical layer comprises an n-doped III-V semiconductor, and the third III-V optical layer comprises a p-doped III-V semiconductor.

4. The edge emitting laser of claim 3, wherein the semiconductor structure comprises an n-doped silicon, the cladding semiconductor layer comprises a p-doped silicon, the first III-V optical layer comprises an n-doped AlGaAs, and the third III-V optical layer comprises a p-doped AlGaAs.

5. The edge emitting laser of claim 1, wherein the second III-V optical layer comprises a quantum well structure or multiple quantum well structures.

6. The edge emitting laser of claim 1, wherein the second III-V optical layer comprises InGaAs.

7. The edge emitting laser of claim 1, wherein the first dielectric layer and the second dielectric layer comprise silicon oxide.

8. The edge emitting laser of claim 1, wherein a width of the semiconductor structure in the first direction is about 0.5

μm to about 2 and a length of the semiconductor structure in the second direction is about 100 μm to about 8000 μm.

9. The edge emitting laser of claim 1, wherein a width in the first direction for the first III-V optical layer is about 20 nm to about 50 nm, for the second III-V optical layer is about 5 nm to about 10 nm, and for the third III-V optical layer is about 20 nm to about 50 nm.

10. The edge emitting laser of claim 1, wherein a width of the cladding semiconductor layer in the first direction is about 0.5 μm to about 2 and a length of the cladding semiconductor layer in the second direction is about 100 μm to about 8000 μM.

11. An edge emitting laser comprising:
a semiconductor structure disposed on a substrate;
a first, a second and a third III-V optical layers sequentially and laterally grown on and from a sidewall of the semiconductor structure;
a cladding semiconductor layer disposed next to the third III-V optical layer and electrically connected to the third III-V optical layer; and
a first contact structure and a second contact structure disposed on and electrically connected to the semiconductor structure and the cladding semiconductor layer, respectively,
wherein each of the first, second and third III-V optical layers independently comprises a III-V semiconductor including at least one of group III elements of boron (B), gallium (Ga), aluminum (Al) and indium (In), and at least one of group V elements of nitrogen (N), phosphorus (P), arsenic (As), antimony (Sb) and bismuth (Bi).

12. The edge emitting laser of claim 11, wherein the semiconductor structure comprises an n-doped silicon, the cladding semiconductor layer comprises a p-doped silicon, the first III-V optical layer comprises an n-doped AlGaAs, the second III-V optical layer comprises InGaAs, the third III-V optical layer comprises a p-doped AlGaAs, and the first III-V optical layer is laterally grown on and from Si (111) crystal plane of the sidewall of the semiconductor structure.

* * * * *